(12) United States Patent
Nakamura et al.

(10) Patent No.: US 9,593,272 B2
(45) Date of Patent: Mar. 14, 2017

(54) SILICA FOR CMP, AQUEOUS DISPERSION, AND PROCESS FOR PRODUCING SILICA FOR CMP

(71) Applicant: TOKUYAMA CORPORATION, Shunan-shi, Yamaguchi (JP)

(72) Inventors: Masahiro Nakamura, Shunan (JP); Ryuji Ishimoto, Shunan (JP)

(73) Assignee: TOKUYAMA CORPORATION, Yamaguchi (JP)

( * ) Notice: Subject to any disclaimer, the term of this patent is extended or adjusted under 35 U.S.C. 154(b) by 0 days.

(21) Appl. No.: 14/904,565

(22) PCT Filed: Jul. 10, 2014

(86) PCT No.: PCT/JP2014/068450
§ 371 (c)(1),
(2) Date: Jan. 12, 2016

(87) PCT Pub. No.: WO2015/012118
PCT Pub. Date: Jan. 29, 2015

(65) Prior Publication Data
US 2016/0177155 A1    Jun. 23, 2016

(30) Foreign Application Priority Data

Jul. 24, 2013   (JP) ................... 2013-153281

(51) Int. Cl.
    *C09K 13/00*      (2006.01)
    *C09K 3/14*       (2006.01)
    (Continued)

(52) U.S. Cl.
    CPC ............ *C09K 3/1463* (2013.01); *B24B 37/00* (2013.01); *B24B 37/044* (2013.01);
    (Continued)

(58) Field of Classification Search
    CPC .. C09K 3/1409; C09K 3/1418; C09K 3/1427; C09K 3/1463; C09K 3/1454;
    (Continued)

(56) References Cited

U.S. PATENT DOCUMENTS 7,197,896 B2 *   4/2007   Celikkaya ............... C03B 19/01
                                                 65/17.4
8,795,581 B2 *   8/2014   Kumar .................... C04B 35/14
                                                 264/651
(Continued)

FOREIGN PATENT DOCUMENTS

JP    2002060214 A    2/2002
JP    2002114510 A    4/2002
(Continued)

OTHER PUBLICATIONS

International Search Report corresponding to Application No. PCT/JP2014/068450; Date of Mailing: Sep. 16, 2014.
(Continued)

*Primary Examiner* — Lan Vinh
(74) *Attorney, Agent, or Firm* — Cantor Colburn LLP

(57) ABSTRACT

To reduce scratches during polishing while ensuring an appropriately high polishing rate, provided are a silica for CMP satisfying the following (A) to (C), an aqueous dispersion using a silica for CMP, and a method of producing a silica for CMP: (A) a BET specific surface area of 40 m²/g or more and 180 m²/g or less; (B) a particle density measured by a He-gas pycnometer method of 2.24 g/cm³ or more; and (C) a coefficient of variation in primary particle diameter calculated by TEM/image analysis of 0.40 or less.

9 Claims, 1 Drawing Sheet

(51) Int. Cl.
*B24B 37/00* (2012.01)
*H01L 21/321* (2006.01)
*C01B 33/18* (2006.01)
*B24B 37/04* (2012.01)

(52) U.S. Cl.
CPC .......... *C01B 33/183* (2013.01); *C09K 3/1409* (2013.01); *H01L 21/3212* (2013.01); *C01P 2006/10* (2013.01); *C01P 2006/12* (2013.01)

(58) Field of Classification Search
CPC ....... C09K 3/14; B24B 37/00; C01P 2006/10; C01P 2006/01
USPC .... 252/79.1, 79.2, 79.3, 79.4; 438/692, 693, 438/694
See application file for complete search history.

(56) References Cited

U.S. PATENT DOCUMENTS

| | | | |
|---|---|---|---|
| 2002/0041963 A1 | 4/2002 | Konya et al. | |
| 2004/0110077 A1* | 6/2004 | Yachi | G03G 9/08797 430/108.6 |
| 2005/0106091 A1* | 5/2005 | Shapira | C01B 33/103 423/335 |
| 2005/0129603 A1 | 6/2005 | Szillat et al. | |
| 2006/0154994 A1 | 7/2006 | Schumacher et al. | |
| 2008/0237535 A1* | 10/2008 | Maejima | C09G 1/02 252/79.1 |
| 2009/0230351 A1* | 9/2009 | Nagatani | B82Y 30/00 252/182.32 |
| 2010/0025373 A1 | 2/2010 | Barthel et al. | |
| 2011/0204283 A1* | 8/2011 | Davis | B82Y 30/00 252/79.1 |
| 2011/0244387 A1 | 10/2011 | Katusic | |
| 2011/0256030 A1 | 10/2011 | Barthel | |

FOREIGN PATENT DOCUMENTS

| | | |
|---|---|---|
| JP | 2005531475 A | 10/2005 |
| JP | 2006193401 A | 7/2006 |
| JP | 2008235481 A | 10/2008 |
| JP | 4257687 B2 | 2/2009 |
| JP | 2010510151 A | 4/2010 |
| JP | 2012511416 A | 5/2012 |
| JP | 2012116734 A | 6/2012 |
| JP | 2012512795 A | 6/2012 |
| WO | 2010122985 A1 | 10/2010 |
| WO | 2011040190 A1 | 4/2011 |

OTHER PUBLICATIONS

Japanese Notice of Reasons for Rejection corresponding to Application No. JP2015-528223; Mailing Date: Sep. 6, 2016, with English translation.

* cited by examiner

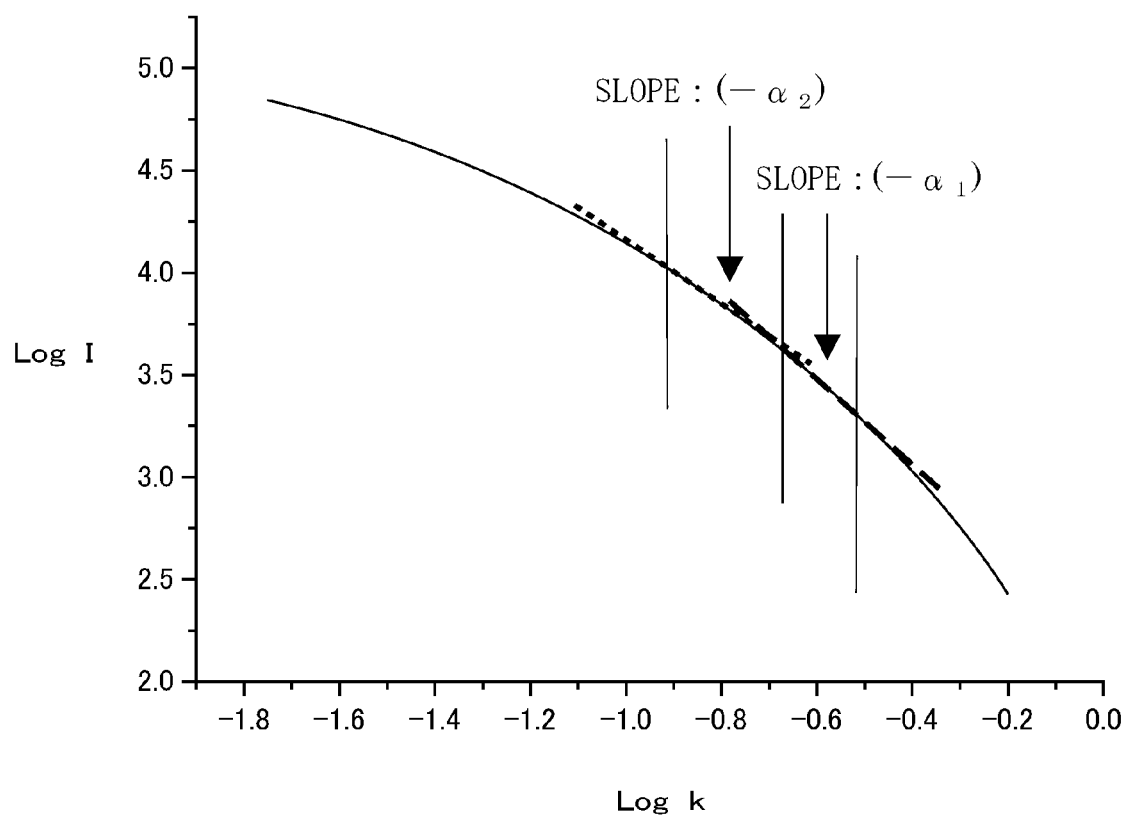

US 9,593,272 B2

SILICA FOR CMP, AQUEOUS DISPERSION, AND PROCESS FOR PRODUCING SILICA FOR CMP

This is the U.S. national stage of application No. PCT/JP2014/068450, filed on Jul. 10, 2014. Priority under 35 U.S.C. §119(a) and 35 U.S.C. §365(b) is claimed from Japanese Application No. 2013-153281, filed Jul. 24, 2013, the disclosure of which is also incorporated herein by reference.

TECHNICAL FIELD

The present invention relates to a silica for CMP, an aqueous dispersion, and a method of producing a silica for CMP.

BACKGROUND ART

Along with an increase in integration of semiconductor devices, a wiring technology is increasingly proceeding in the direction of miniaturization and an increase in number of layers. Then, due to the increase in number of layers in the wiring technology, the difference in level of a semiconductor substrate surface increases, and the gradient of wiring with respect to the substrate becomes steep. Therefore, the processing accuracy and reliability of the wiring to be formed in an upper portion of the substrate tend to decrease.

In order to solve the above-mentioned problem, a chemical mechanical polishing method (hereinafter sometimes referred to as "CMP method") is drawing attention. The CMP method is a polishing method involving a combination of a mechanical removal action of particles, including abrasive grains, and a chemical removal action of a processing liquid, and in the CMP method, an abrasive (aqueous dispersion) in which fine particles, such as silica or alumina, are mixed and dispersed in an alkaline or acidic chemical aqueous solution and a polishing pad are used. For example, in a silicon wafer surface, it is generally considered that a hydrate film generated on the wafer surface, rather than the wafer surface itself, is removed with the abrasive grains, and thus processing proceeds. The CMP method has a feature in that the depth of an affected layer is substantially negligible, and the wafer surface is mirror-finished with high efficiency.

An object is processed by selecting the polishing pad, abrasive grains, the kind, concentration, and pH of the processing liquid, and the like depending on the object to be processed. For example, in the CMP of an oxide film ($SiO_2$), a hydrate such as $Si(OH)_4$ formed through the cleavage of a Si—O—Si bond is removed with fine particles through use of a silica slurry having a pH controlled with an alkali, such as KOH. Meanwhile, the CMP of metal is considered to have a mechanism in which a metal oxide film generated on the surface of the metal is removed with fine particles through use of a slurry in which alumina or silica particles are dispersed in an acidic solution having an oxidant added thereto.

In recent years, such CMP method has rapidly spread as a procedure for flattening an interlayer insulating film such as a silicon oxide film, a metal film of aluminum, tungsten, copper, or the like forming a wiring layer, and a material such as TiN, TaN, or SiN during production steps of a semiconductor device. An abrasive to be used in the CMP method is required to have various performances such as low contamination with respect to an object to be polished, a small number of scratches, high polishing efficiency, and a high selection ratio of polishing a silicon oxide film.

The above-mentioned performances of the abrasive significantly depend on abrasive grain components, such as silica or cerium oxide, which serves as a main raw material. For example, an abrasive using fumed silica as abrasive grains, which has been often used hitherto, is excellent in purity and has high polishing efficiency. However, in the CMP method, this abrasive has a problem in that a large number of scratches are caused also by the influence of chemical components. In an abrasive using colloidal silica as abrasive grains, although scratches are reduced, this abrasive has polishing efficiency lower than that of fumed silica and also has a problem in terms of purity. It has been known that an abrasive using cerium oxide as abrasive grains has high polishing efficiency. However, a large number of scratches are caused by poor dispersion stability, and there is also a problem in terms of purity.

In Patent Literature 1, there is a disclosure of the comparison of scratch characteristics of slurries for chemical mechanical polishing using colloidal silica and fumed silica (hereinafter sometimes referred to as "slurry for CMP"), and there is also a disclosure of the tendency that a large number of scratches occur in the slurry for CMP using fumed silica compared to the slurry for CMP using colloidal silica.

CITATION LIST

Patent Literature

[PTL 1] JP 4257687 B2

SUMMARY OF INVENTION

Technical Problem

When scratches occur in the above-mentioned CMP method, wiring of a device is disconnected or short-circuited, which causes a significant decrease in yield of the device. Meanwhile, in the CMP method, a polishing rate of a predetermined value or more is also required from the viewpoint of ensuring productivity.

The present invention has been made in view of the above-mentioned circumstances, and its object is to provide a silica for CMP capable of reducing scratches during polishing while ensuring an appropriately high polishing rate, an aqueous dispersion using the silica for CMP, and a method of producing a silica for CMP.

Solution to Problem

The inventors of the present invention have made extensive investigations so as to solve the above-mentioned problem, and as a result, have found that, in the case where silica, in particular, fumed silica is used as abrasive grains for CMP, the particle density of silica and the primary particle diameter distribution thereof significantly influence the occurrence of scratches. The mechanism is not clear regarding how the particle density of silica and the primary particle diameter distribution thereof influence the occurrence of scratches during polishing. However, the inventors of the present invention have considered that, when the aggregated particles of silica are pressed as abrasive grains against a surface to be polished, the elastic deformation thereof is large in the case where the particle density of silica is low, with the result that scratches are liable to occur. Further, the inventors of the present invention have considered that, when the primary particle diameter distribution of silica increases, the particle shape and the particle size distribution of the aggregated particles serving as abrasive grains similarly vary significantly, with the result that scratches are liable to occur.

Then, the inventors of the present invention have found that scratches during polishing can be significantly reduced even when silica is used in the CMP method by increasing the particle density of silica to a particular value and decreasing the primary particle diameter distribution thereof to a particular value, which have not been attempted hitherto, to thereby achieve the present invention.

That is, according to one embodiment of the present invention, there is provided a silica for CMP, which satisfies the following (A) to (C):

(A) a BET specific surface area of 40 $m^2/g$ or more and 180 $m^2/g$ or less;

(B) a particle density measured by a He-gas pycnometer method of 2.24 $g/cm^3$ or more; and (C) a coefficient of variation in primary particle diameter calculated by TEM/image analysis of 0.40 or less.

In one embodiment of the present invention, it is preferred that the silica for CMP have a fractal shape parameter $\alpha$max value within a particle diameter range of from 3 nm to 70 nm of 2.9 or more.

In another embodiment of the present invention, it is preferred that the silica for CMP have a content of Fe of 0.4 ppm or less in terms of $Fe_2O_3$.

In another embodiment of the present invention, it is preferred that the silica for CMP have a content of Al of 0.3 ppm or less in terms of $Al_2O_3$, a content of Ni of 0.1 ppm or less, a content of Cr of 0.1 ppm or less, a content of boron of 1.3 ppm or less, and a content of phosphorus of 0.5 ppm or less.

In another embodiment of the present invention, it is preferred that the silica for CMP include fumed silica produced by a flame hydrolysis reaction of a silane compound.

According to one embodiment of the present invention, there is provided an aqueous dispersion, including the silica for CMP according to the embodiment of the present invention.

According to one embodiment of the present invention, there is provided a method of producing a silica for CMP for producing a silica for CMP by subjecting a silane compound to hydrolysis in flame formed in a reaction vessel, the method including producing, under a production condition of an adiabatic flame temperature of 1,800° C. or more and a pressure in the reaction vessel of 10 kPaG or more, a silica for CMP satisfying the following (A) to (C):

(A) a BET specific surface area of 40 $m^2/g$ or more and 180 $m^2/g$ or less;

(B) a particle density measured by a He-gas pycnometer method of 2.24 $g/cm^3$ or more; and (C) a coefficient of variation in primary particle diameter calculated by TEM/image analysis of 0.40 or less.

In one embodiment of the present invention, in the method of producing a silica for CMP, it is preferred that the flame be formed by a multi-tube burner, the silane compound be supplied to the flame by being supplied to a center tube of the multi-tube burner, and a gas flow rate in the center tube of the multi-tube burner be from 50 m/sec to 100 m/sec in terms of a standard state.

Advantageous Effects of Invention

According to the embodiments of the present invention described above, the silica for CMP capable of reducing scratches during polishing while ensuring an appropriately high polishing rate, the aqueous dispersion using the silica for CMP, and the method of producing a silica for CMP can be provided.

BRIEF DESCRIPTION OF DRAWINGS

FIG. 1 is a graph for showing a method of determining a fractal shape parameter $\alpha$ value based on a relationship between a scattering intensity (I) and a scattering vector (k) by small-angle X-ray scattering.

DESCRIPTION OF EMBODIMENTS

A silica for CMP according to one embodiment of the present invention is used for chemical mechanical polishing. The polishing application of the silica for CMP according to the embodiment of the present invention, which is not particularly limited, is preferably at least any polishing application selected from CMP steps for a semiconductor device, specifically, CMP of a metal film that is a conductor, CMP of polysilicon that is a semiconductor, CMP of a silicon oxide film (insulating film) that is a non-conductor, and the like. Further, there is no particular limitation on a method of producing the silica for CMP according to the embodiment of the present invention, but it is particularly preferred to employ a flame hydrolysis reaction of a silane compound, that is, a production method involving subjecting a silane compound to hydrolysis in flame of an inflammable gas that burns to generate water vapor, such as hydrogen gas, and an oxygen-containing gas, such as air.

The silica for CMP according to the embodiment of the present invention has a BET specific surface area of 40 $m^2/g$ or more and 180 $m^2/g$ or less. The BET specific surface area is preferably 50 $m^2/g$ or more and 155 $m^2/g$ or less, more preferably 75 $m^2/g$ or more and 100 $m^2/g$ or less. When the BET specific surface area is less than 40 $m^2/g$, the polishing rate decreases significantly, and hence an appropriately high polishing rate cannot be ensured. Meanwhile, when the BET specific surface area is more than 180 $m^2/g$, scratches during polishing increase.

The greatest feature of the silica for CMP according to the embodiment of the present invention is that its primary particles are denser than normal ones, and the particle density measured by a He-gas pycnometer method is 2.24 $g/cm^3$ or more. The particle density is preferably 2.25 $g/cm^3$ or more and 2.60 $g/cm^3$ or less, particularly preferably 2.25 $g/cm^3$ or more and 2.30 $g/cm^3$ or less. The particle density of general fumed silica to be used for a CMP application is less than 2.23 $g/cm^3$, and there are no examples of an attempt to use, as abrasive grains for a CMP application, silica having a large particle density like the silica for CMP according to the embodiment of the present invention. Thus, the use of the silica for CMP according to the embodiment of the present invention is groundbreaking.

By using as abrasive grains silica having a large particle density as described above, the occurrence of scratches on a surface to be polished can be significantly suppressed in a CMP method. Although it is not exactly clear how the magnitude of the particle density influences the occurrence mechanism of scratches during polishing, it is presumed that the mechanism may be related to the fact that, when abrasive grains are pressed against a surface to be polished, the elastic deformation of the grains at contact points decreases when the particle density is large. That is, the following is presumed. As the particle deformation when the abrasive grains are pressed against the surface to be polished is smaller, the contact area between the particles and the surface to be polished becomes smaller. As a result, when the abrasive grains are separated from a state of adhering to the surface to be polished, the frequency at which an adhesion surface itself is scraped off together is reduced.

It should be noted that, with regard to the maximum particle density of amorphous silica, the existence of amorphous silica having a density of 2.6 g/cm$^3$ obtained by high-temperature and high-pressure treatment or neutron treatment is known (Takayasu Goto et al., "Elastic Moduli, Hardness, and Thermal Expansivity of Densified Fused Silica," Feb. 14, 1983, The Society of Material Science Japan).

Further, the silica for CMP according to the embodiment of the present invention has a coefficient of variation in primary particle diameter calculated by TEM/image analysis of 0.40 or less. The coefficient of variation is preferably 0.38 or less, more preferably 0.36 or less. A smaller coefficient of variation in primary particle diameter means that the particle diameters of the primary particles are uniform. In the case where such particles are used as polishing abrasive grains, the size of the abrasive grains to be formed is also uniform, and a force with which the abrasive grains are pressed against the surface to be polished becomes uniform. As a result, the surface to be polished can be polished more smoothly, which is preferred. When the coefficient of variation becomes large, in the case where such particles are used as polishing abrasive grains, the variation in particle diameter becomes large in abrasive grains formed of aggregated primary particles. As a result, the force with which the abrasive grains are pressed against the surface to be polished becomes non-uniform, and further, the content of coarse particles, which cause scratches, increases, which is not preferred. It should be noted that the lower limit value of the coefficient of variation is not particularly limited and is preferably as close as possible to zero. In practical use, the lower limit value is preferably 0.05 or more, more preferably 0.24 or more.

In general, fumed silica produced in flame has a particle size distribution larger than that of colloidal silica. In particular, this tendency is conspicuous in fumed silica having a low specific surface area of 155 m$^2$/g or less, and in this case, the coefficient of variation in primary particle diameter is larger than 0.40 in most cases and is about 0.60 in some cases. Fumed silica having such large coefficient of variation is also generally used as abrasive grains for CMP. It should be noted that the minimum value of the coefficient of variation in primary particle diameter of fumed silica is generally about 0.25. Further, the coefficient of variation in primary particle diameter of colloidal silica is about 0.1.

The coefficient of variation in primary particle diameter is calculated by the following expression (1) through use of the number-based average particle diameter of primary particles obtained by analyzing an image of a transmission electron microscope (TEM) and the particle diameter standard deviation.

Coefficient of variation in primary particle diameter=Particle diameter standard deviation/average particle diameter     Expression (1)

In the silica for CMP according to the embodiment of the present invention, the maximum value of a fractal shape parameter α within a particle diameter range of from 3 nm to 70 nm (hereinafter referred to as "αmax value") is preferably 2.9 or more. The fractal shape parameter is a "fractal shape parameter (α value) serving as an indicator of a particle shape" corresponding to the frequency of periodic structures having various sizes, and the detail thereof is described in, for example, D. W. Schaefer et al.", "Physical Review Letters, Volume 52, Number 26, p. 2371-p. 2374 (1984). It should be noted that the contents of this article are incorporated herein as part of the description of the Description of the present application.

That is, the α value can be determined by small-angle X-ray scattering measurement. In the small-angle X-ray scattering measurement, information on a periodic structure of a nanometer or more (information on the period and frequency of a structure), which cannot be obtained by general X-ray diffraction, can be obtained, and hence the α value is determined based on this information.

Specifically, the fractal shape parameter α value is measured by the following method. That is, a scattering intensity (I), a scattering vector (k), and a fractal shape parameter (α) after background correction in the small-angle X-ray scattering have a relationship of the following expression (2), and hence the α value can be determined based on a small-angle X-ray scattering curve plotted with the horizontal axis being defined as k and the vertical axis being defined as I.

$$I \propto k^{-\alpha} \qquad \text{Expression (2)}$$

where k=4 $\pi\lambda^{-1}$ sin θ.

In the expression:
I represents a scattering intensity;
k represents a scattering vector (unit: nm$^{-1}$);
π represents a circular constant;
λ represents a wavelength of incident X-ray (unit: nm); and
θ represents an X-ray scattering angle (θ represents a value obtained by multiplying the scanning angle of a detector by 0.5 times).

In order to obtain the small-angle X-ray scattering curve, first, a monochromatized X-ray is narrowed through use of a slit and a block and radiated to a sample. Then, an X-ray scattered by the sample is detected while the scanning angle of a detector is changed. Then, as illustrated in FIG. 1, a relationship is determined, which is plotted with the horizontal axis being defined as a scattering vector (k) determined by the above-mentioned expression based on the X-ray scattering angle (θ) and the vertical axis being defined as a scattering intensity (I) having been subjected to background correction. In this case, when the relationship is plotted on a double logarithmic scale, the slope of a tangent of the small-angle X-ray scattering curve at a certain value of k becomes equal to –α, and hence the α value can be determined.

It should be noted that the background correction can be performed by subtracting the scattering intensity of only a measurement cell not having a sample from the scattering intensity of the sample. Herein, when the size of an object to be analyzed for the α value is defined as D (nm), D, the X-ray scattering angle θ, and the incident X-ray wavelength λ have a relationship of a Bragg equation (2D×sin θ=λ), and hence a relationship of the following expression holds between k and D.

$$D=2\pi k^{-1}$$

Herein, in the case where the silica for CMP is measured for such small-angle X-ray scattering, the α value corresponding to the frequency of a periodic structure of each size in primary particles and an aggregated particle structure thereof can be determined by analyzing the obtained small-angle X-ray scattering curve. It should be noted that, when the primary particle diameter of the silica for CMP is more than 70 nm in the case of analysis of the α value, the aggregation structure of the silica for CMP cannot be expressed correctly due to the influence of the bulk density. However, the silica for CMP according to the embodiment of the present invention has a BET specific surface area of 40 m²/g or more as described above. In this case, the content of particles having a primary particle diameter of more than 70 nm is small, and the influence of the bulk density is about 2%, which is negligible. Thus, each α value can be measured regarding a partial structure of primary particles and aggregated particles thereof within a range of from 3 nm to 70 nm. Then, each α value within a range of from 3 nm to 70 nm is plotted, and the maximum value thereof is determined as the αmax value.

Meanwhile, it is known that the α value is 4 when the periodic structure has a smooth surface and decreases as the surface becomes rough (see, for example, Hideki Matsuoka, "An Introduction to Small-angle Scattering—What is understood from small-angle scattering of X-ray and neutrons—, the Journal of the Crystallographic Society of Japan, Vol. 41, No. 4 (1999), pp. 213-226, in particular p. 224). Thus, the fact that the above-mentioned αmax value is large, i.e., close to 4 in fumed silica means that fumed silica has a surface portion with satisfactory smoothness within a size range of from 3 nm to 70 nm.

The size of the abrasive grains in a slurry of the CMP method is roughly about 0.1 μm. When the aggregated particles of fumed silica are pressed as abrasive grains against a surface to be polished, the size for each contact surface is considered to be about from 3 nm to 70 nm. The fact that the surface is smooth in this unit means that scratches are less liable to occur on the surface to be polished. In order to make it more difficult for scratches to occur on the surface to be polished in the silica for CMP according to the embodiment of the present invention, the αmax value is preferably 2.9 or more, more preferably 3.1 or more, still more preferably 3.2 or more. It should be noted that the upper limit of the αmax value, which is not particularly limited, is preferably as close as possible to 4, more preferably 3.8 or less in practical use.

Further, in the silica for CMP according to the embodiment of the present invention, the content of Fe in terms of $Fe_2O_3$ is preferably 0.4 ppm or less, more preferably 0.2 ppm or less. When the content of Fe is set to 0.4 ppm or less, the occurrence of scratches during polishing can be further reduced. It is not clear how the content of Fe influences the occurrence mechanism of scratches during polishing. However, in general, there is a tendency that scratches increase along with an increase in concentration of Fe. In the case where the content of Fe is less than the above-mentioned range, the occurrence of scratches can be more highly suppressed. The Fe is generally derived from a raw material for the silica, but abrasion powder from a reaction vessel, a pipe, or the like may be mixed in the silica.

It should be noted that, as the contents of impurities other than the Fe in the silica for CMP according to the embodiment of the present invention, it is preferred that the content of Al be 0.3 ppm or less in terms of $Al_2O_3$, the content of Ni be 0.1 ppm or less, the content of Cr be 0.1 ppm or less, the content of boron be 1.3 ppm or less, and the content of phosphorus be 0.5 ppm or less. The silica for CMP having impurities reduced as described above is preferred because the silica can be suitably used in a CMP application requiring the use of abrasive grains with a particularly high purity, for example, the CMP steps for a semiconductor device described above. It should be noted that, in fumed silica produced by flame hydrolysis of a silane compound, in general, of the above-mentioned impurities, boron and phosphorus are derived from the raw material, and Al, Ni, and Cr are derived not only from the raw material but also from abrasion powder from a reaction vessel, a pipe, or the like. When the amounts of those impurities increase, the impurities are liable to contaminate the surface to be polished during polishing. Such case is not preferred because the contamination caused by the impurities may decrease electric characteristics of a substrate or the like depending on the material and application of an object to be polished.

The silica for CMP according to the embodiment of the present invention described above is generally used in the CMP method as an aqueous dispersion in which the silica for CMP is dispersed in an aqueous medium.

A production method for the aqueous dispersion is not particularly limited as long as the silica for CMP according to the embodiment of the present invention is used as the abrasive grains, and a known production method for an aqueous dispersion can be used without limitation. In an aqueous dispersion according to one embodiment of the present invention, it is preferred that the concentration of the silica for CMP fall within a range of from 1 wt % to 60 wt %. It is not preferred that the concentration of the silica for CMP increase to become more than 60 wt % because there is a problem of stability in that the dispersion viscosity increases and the gelling time of the aqueous dispersion becomes significantly short. Further, in the case where the concentration of the silica for CMP is less than 1 wt %, the dispersion becomes insufficient. Therefore, it may be difficult to ensure the practical polishing rate. Further, an aqueous dispersion having a high concentration can be used by being diluted to a desired concentration depending on the application.

The aqueous dispersion according to the embodiment of the present invention may contain, as dispersion particles, only the silica for CMP according to the embodiment of the present invention, and may further contain other particles, such as existing silica particles, ceria particles, and alumina particles.

As the aqueous medium, a polar medium is suitably used, and in general, a typical example thereof is water. However, other than water, alcohols, ethers, ketones, or the like can also be used. Further, a mixed solvent of water and another polar solvent may also be employed.

The aqueous dispersion may contain known additives, such as a polishing accelerator, an oxidant, an acid, a complexing agent, a corrosion inhibitor, and a surfactant without particular limitation within a range not impairing the water dispersibility of the silica for CMP.

Examples of the polishing accelerator include a piperazine, a primary amine compound having 1 to 6 carbon atoms, and a quaternary ammonium salt. Examples of the piperazine include piperazine, anhydrous piperazine, piperazine hexahydrate, N-aminoethylpiperazine, and 1,4-bis(3-aminopropyl)piperazine. Examples of the primary amine compound having 1 to 6 carbon atoms include α-oxyethylamine (α-aminoethyl alcohol), monoethanolamine (β-aminoethyl alcohol), aminoethylethanolamine, triethylenetetramine, and ethylenediamine. Examples of the quaternary ammonium salt include tetramethylammonium chloride, tetramethylammonium hydroxide, dimethyldiethylammonium chloride, N,N-dimethylmorpholinium sulfate, and tetrabutylammonium bromide. One kind of the polishing accelerators may be used alone, or two or more kinds thereof may be used in combination. The content of the polishing accelerator in the aqueous dispersion according to the embodiment of the present invention, which is not particularly limited, is preferably about from 0.001 wt % to 5 wt % of the entire amount of the aqueous dispersion.

Examples of the oxidant include a peroxide, a perchlorate, a periodate, a persulfate, an oxidizing metal salt, and an oxidizing metal complex. Of those, hydrogen peroxide, ammonium persulfate, and the like are preferably used from the viewpoint of the ease of handling, the purity, and the like. Further, potassium iodate, periodic acid, potassium iodide, iodic acid, and the like can also be used. In general, the oxidant is decomposed gradually when left in air and the oxidizing power thereof decreases in most cases. Therefore, it is desired to add the oxidant at the time of use. For example, one kind of the oxidants may be used alone, or two or more kinds thereof may be used in combination. The content of the oxidant in the aqueous dispersion according to the embodiment of the present invention, which is not particularly limited, is preferably about from 0.01 wt % to 20 wt % of the entire amount of the aqueous dispersion.

Any known organic acid and mineral acid can be used as the acid without limitation. An example of the mineral acid is hydrochloric acid, and examples of the organic acid include: monocarboxylic acids each having 2 to 6 carbon atoms, such as formic acid, acetic acid, propionic acid, butyric acid, valeric acid, and lactic acid; dicarboxylic acids each having 2 to 6 carbon atoms, such as oxalic acid, malonic acid, succinic acid, tartaric acid, malic acid, and fumaric acid; tricarboxylic acids each having 3 to 6 carbon atoms, such as citric acid and isocitric acid; aromatic carboxylic acids, such as salicylic acid; ascorbic acid; and an amino acid. The acid also includes salts of the above-mentioned carboxylic acids and ascorbic acid. One kind of the acids may be used alone, or two or more kinds thereof may be used in combination. The content of the acid in the aqueous dispersion according to the embodiment of the present invention, which is not particularly limited, is preferably about from 0.005 wt % to 5 wt % of the entire amount of the aqueous dispersion.

Examples of the complexing agent include ethylenediaminetetraacetic acid (EDTA), hydroxyethylethylenediaminetriacetic acid (HEDTA), diethylenetriaminepentaacetic acid (DTPA), nitrilotriacetic acid (NTA), triethylenetetramineheptaacetic acid (TTHA), hydroxyethyliminodiacetic acid (HIDA), dihydroxyethylglycine (DHEG), ethylene glycol-bis(β-aminoethyl ether)-N,N'-tetraacetic acid (EGTA), and 1, 2-diaminocyclohexane-N,N,N',N'-tetraacetic acid (CDTA). One kind of the complexing agents may be used alone, or two or more kinds thereof may be used in combination. The content of the complexing agent in the aqueous dispersion according to the embodiment of the present invention, which is not particularly limited, is about from 0.005 wt % to 5 wt % of the entire amount of the aqueous dispersion.

Examples of the corrosion inhibitor include benzotriazole, tolyltriazole, benzotriazole-4-carboxylic acid and an alkyl ester thereof, naphthotriazole and a derivative thereof, imidazole, quinaldic acid, and an invar derivative. One kind of the corrosion inhibitors may be used alone, or two or more kinds thereof may be used in combination. The content of the corrosion inhibitor in the aqueous dispersion according to the embodiment of the present invention, which is not particularly limited, is preferably from 0.005 wt % to 0.5 wt % of the entire amount of the aqueous dispersion.

Examples of the surfactant include: anionic surfactants, such as polyacrylate, an alkylbenzenesulfonate, an alkanesulfonate, and an α-olefinsulfonate; and nonionic surfactants, such as a fatty acid monoethanolamide, a fatty acid diethanolamide, a fatty acid ethylene glycol ester, a mono-fatty acid glycerin ester, a fatty acid sorbitan ester, a fatty acid sucrose ester, an alkyl polyoxyethylene ether, polyvinylpyrrolidone, polyvinyl alcohol, hydroxyethylcellulose, carboxymethylcellulose, and polyethylene glycol. One kind of the surfactants may be used alone, or two or more kinds thereof may be used in combination. The content of the surfactant, which is not particularly limited, is preferably about 1 wt % or less, more preferably about from 0.001 wt % to 1 wt % of the entire amount of the aqueous dispersion.

The pH of the aqueous dispersion according to the embodiment of the present invention can be appropriately adjusted to an alkaline, neutral, or acidic region depending on an object to be polished. In general, in the case where silica abrasive grains are used, the aggregation of particles is liable to occur in the neutral region, which causes scratches during polishing. Therefore, it is preferred to adjust the pH to from 1 to 5 or from 8 to 11.

Further, when the aqueous dispersion is stored for a long period of time, fungi and bacteria may occur. In such a case, an antimicrobial agent may be added to the aqueous dispersion according to the embodiment of the present invention. There is no particular limitation on the antimicrobial agent, and any commercially available agent that does not degrade the performance as the abrasive may be added. The addition amount, which is not particularly limited, may be generally selected from the range of from 1 ppm to 1,000 ppm.

Next, a method of producing a silica for CMP of one embodiment of the present invention is described. There is no particular limitation on the method of producing a silica for CMP according to the embodiment of the present invention, and any method of producing silica fine particles can be employed as long as produced silica fine particles satisfy the following conditions (A) to (C). However, it is preferred that the method of producing a silica for CMP according to the embodiment of the present invention be a method capable of producing fumed silica satisfying the following conditions (A) to (C) by subjecting a silane compound to the flame hydrolysis reaction:

(A) a BET specific surface area of 40 $m^2/g$ or more and 180 $m^2/g$ or less;

(B) a particle density measured by a He-gas pycnometer method of 2.24 $g/cm^3$ or more; and (C) a coefficient of variation in primary particle diameter calculated by TEM/image analysis of 0.40 or less.

In the case of utilizing a method of producing fumed silica, involving supplying a silane compound to a reaction vessel to subject the silane compound to hydrolysis in flame, in producing the silica for CMP according to the embodiment of the present invention, a production method involving setting an adiabatic flame temperature to 1,800° C. or more and setting the pressure in the reaction vessel to 10 kPaG or more can be utilized. In a general production method involving a flame hydrolysis method for fumed silica, the adiabatic flame temperature is set to a melting point or less, that is, 1,650° C. or less in most cases (for example, in JP 58-54085 B2, there is a disclosure of a generally desired range of the flame temperature of about from 800° C. to 1,400° C.). Further, the pressure in the reaction vessel is a negative pressure in most cases. That is, the flame hydrolysis method using a combination of the high adiabatic flame temperature and the high pressure in the reaction vessel described above cannot be performed without repeating a trial based on the concept of satisfying the conditions (A) to (C).

When the adiabatic flame temperature is set to 1,800° C. or more, which is a high temperature exceeding the melting point of silica, generated silica fine particles are aggregated to grow in a molten state in flame, and hence a gas contained in a gap between the particles is easily discharged. As a result, fumed silica having a high particle density can be obtained. Meanwhile, it is not preferred that the adiabatic flame temperature be less than 1,800° C. because silica having a high specific surface area or silica having a low powder density is generated. It is preferred that the adiabatic flame temperature become high because the shape of primary particles becomes close to a spherical shape. However, when the adiabatic flame temperature becomes more than the boiling point of silica, it becomes difficult to control the shape of particles, and a large amount of energy is consumed. Therefore, it is generally preferred that the upper limit value of the adiabatic flame temperature be 2,250° C. or less. Thus, it is sufficient to adjust the supply amounts of an inflammable gas and an oxygen-containing gas that form flame and the supply amount of a silane compound so that the adiabatic flame temperature falls within the above-mentioned range.

It should be noted that the adiabatic flame temperature can be calculated by a method described in "A Study on the Formation of Fumed Silica" (Journal of the Surface Science Society of Japan, Vol. 5, No. 1, pp. 35-39, published in 1984). It should be noted that the contents of this article are incorporated herein as part the description of Description of the present application.

Further, in the production method, it is preferred that the reaction vessel for burning the silane compound in flame adopt a closed system in which the atmosphere in the reaction vessel is completely cut off from the air, from the viewpoint of making it easy to keep the pressure in the reaction vessel and preventing contaminants from entering the reaction vessel. That is, a burner is set in the reaction vessel, a gas supplied to the burner and the reaction vessel, a gas discharged from the reaction vessel, and fumed silica each flow through a pipe.

As the pressure in the reaction vessel is higher, the flame length becomes shorter and the temperature distribution in flame decreases. As a result, fumed silica having a small coefficient of variation in primary particle diameter, with the particle diameter being uniform, can be obtained. The pressure in the reaction vessel can be easily measured by setting a pressure meter at any position, and the position is not particularly limited except for the vicinity of an outlet port of the reaction vessel for discharging a gas from the reaction vessel. The pressure in the vicinity of the outlet port of the reaction vessel is liable to fluctuate owing to the flow rate of a discharged gas or the like. It should be noted that the pressure is measured by setting the pressure meter generally on a ceiling wall surface or an upper side wall surface of the reaction vessel in consideration of the adhesion of the generated fumed silica.

It is not preferred that the pressure in the reaction vessel be less than 10 kPaG because the flame length becomes long and the temperature distribution in flame increases particularly under a negative pressure, with the result that fumed silica having a large coefficient of variation in primary particle diameter is produced. In general, it is preferred that the pressure in the reaction vessel be set to 1 MPaG or less for the reasons of the withstanding pressure of a device, the upper limit of a pressure of a raw material supply pump, and the like. There is no particular limitation on a method of adjusting the pressure in the reaction vessel, but the pressure in the reaction vessel can be adjusted by applying a pressure loss to the amount of a gas introduced into the reaction vessel and the amount of the gas at the outlet port of the reaction vessel or in a subsequent step.

It should be noted that the adiabatic flame temperature is preferably 1,850° C. or more, more preferably 1,950° C. or more. The pressure in the reaction vessel is preferably 11 kPaG or more, more preferably 20 kPaG or more.

In the reaction vessel, flame is generally formed with a burner. As the burner, a multi-tube burner having a cross section of a concentric shape is preferably used from the viewpoint of the ease of lighting, the stability of burning, and the like. The multi-tube burner is formed of a center tube and a plurality of annular tubes spreading in a concentric manner from the center tube. In general, a double tube, a triple tube, or a quadruple tube is used, and in particular, a triple tube is preferred. In general, a multi-tube burner having a center tube diameter of about from 25 mm to 120 mm is used.

For forming flame with the multi-tube burner, at a burning port of the burner, the inflammable gas and the oxygen-containing gas may be supplied to the center tube and each annular tube separately or as a mixed gas with a mixing ratio being changed, so as to obtain a desired burning ratio for obtaining the above-mentioned adiabatic flame temperature. Specifically, in the case of the triple tube in which a first annular tube and a second annular tube are arranged in the stated order from the center tube side to an outer side in a radial direction of the center tube, it is suitable that hydrogen and air be supplied to the center tube, hydrogen and air be supplied to the first annular tube, and only air be supplied to the second annular tube.

In forming flame through use of the multi-tube burner, it is sufficient that a vaporized silane compound be also supplied to any gas supply tube of the multi-tube burner to cause the hydrolysis reaction to proceed in flame. It is particularly preferred to supply the silane compound to the center tube because the vaporized silane compound is supplied mainly to a center of a base portion of the flame, and the hydrolysis reaction proceeds stably.

When fumed silica having a fractal shape parameter $\alpha$max value of 2.9 or more is to be produced by the method of producing a silica for CMP according to the embodiment of the present invention, the vaporized silane compound is supplied to the reaction vessel so as to be introduced into the center tube of the multi-tube burner, and further, its gas flow rate is set to preferably from 30 m/sec to 200 m/sec, more preferably from 50 m/sec to 100 m/sec in terms of a standard state. When the gas flow rate is set to a range of from 30 m/sec to 200 m/sec, a period of time for which the silane compound or decomposed components thereof are retained in flame becomes appropriate for generating fumed silica having an $\alpha$max value of 2.9 or more. When the gas flow rate increases to be more than the above-mentioned range, it becomes difficult to maintain the flame stably. When the gas flow rate decreases to be lower than the above-mentioned range, a period of time for which the silane compound or decomposed components thereof are retained in the flame becomes long. Therefore, the fractal shape parameter $\alpha$max value decreases, and the $\alpha$max value is liable to become less than 2.9. It should be noted that the standard state of a gas as used herein refers to standard temperature and pressure (STP).

The silane compound serving as a raw material for fumed silica, which is not particularly limited, may be an organic silane, a halogenated silane, or the like, and it is preferred that the silane compound have a boiling point of 250° C. or less so that the silane compound is gasified to be easily supplied to the multi-tube burner. Specific examples thereof include tetraethoxysilane, octamethylcyclosiloxane, decamethylpentacyclosiloxane, methyltrichlorosilane, methyldichlorosilane, trimethylchlorosilane, dimethyldichlorosilane, 1,2-dimethyltetrachlorodisilane, 1,1,2-trimethyltrichlorodisilane, 1,1,2,2-tetramethyldichlorosilane, 1,1,1,2-tetramethyldichlorosilane, tetrachlorosilane, and trichlorosilane.

As described above, in the silica for CMP according to the embodiment of the present invention, it is preferred that the content of Fe be 0.4 ppm or less (more preferably 0.2 ppm or less) in terms of $Fe_2O_3$. In order to obtain fumed silica having such a content of Fe, it is preferred to use a raw material gas to be supplied to the burner, in which the content of Fe is reduced. For example, tetrachlorosilane is used as the raw material gas, it is preferred that the content of Fe in the raw material gas be 0.15 ppm or less in terms of $Fe_2O_3$.

Similarly, it is preferred that the silane compound be a compound capable of realizing the contents of impurities suitable as the silica for CMP according to the embodiment of the present invention described above, regarding Al, Ni, boron, and phosphorus which are impurities other than Fe. For example, in the case of using tetrachlorosilane as the raw material gas, it is preferred that, as the contents of impurities in the raw material gas, the content of Al be 0.1 ppm or less in terms of $Al_2O_3$, the content of Ni be 350 ppb or less, the content of Cr be 350 ppb or less, the content of boron be 460 ppb or less, and the content of phosphorus be 180 ppb or less.

It should be noted that, of the above-mentioned impurities, Fe, Al, Ni, and Cr may be mixed in from abrasion powder depending on the materials of a reaction vessel, a pipe, and the like. Therefore, the mixed amount from the reaction vessel, the pipe, and the like is determined experimentally, and the amount of impurities in the silane compound may be limited so that fumed silica with a desired purity is obtained. Some parts of the reaction vessel, the pipe, and the like are exposed to a hydrochloric gas, which is highly corrosive at high temperature. Therefore, it is preferred that a material to be used in an atmosphere of high-temperature hydrogen chloride be selected from high-temperature corrosion-resistant materials, such as inconel, hastelloy, stainless steel, and ceramics. Further, it is preferred that a material to be used in an atmosphere of low-temperature hydrogen chloride be selected from titanium, aluminum, stainless steel, polytetrafluoroethylene, and other corrosion-resistant metals or resin materials.

As the inflammable gas for forming flame, a hydrogen gas can be suitably used. However, other than the hydrogen gas, for example, a hydrocarbon gas having 1 to 13 carbon atoms, such as methane or propane, or gaseous alcohols having 1 to 13 carbon atoms, such as gaseous methanol, can also be used. The inflammable gas is required for subjecting silane to hydrolysis and allowing the surface of silica to have an active OH group, and also serves as a fire source for allowing stable flame to continue. Further, part of the inflammable gas that burns to generate water vapor may also be added directly as water vapor. Meanwhile, as the oxygen-containing gas, air is preferred from an economic viewpoint.

As a specific embodiment in which a silane compound is subjected to hydrolysis in flame in the method of producing a silica for CMP according to the embodiment of the present invention, there may be given an embodiment in which, in the case of using a triple tube burner having a center tube diameter of 100 mm, a vaporized silane compound within a range of from 4.3 kmol/h to 13 kmol/h, hydrogen within a range of from 300 $Nm^3/h$ to 800 $Nm^3/h$, and air within a range of from 100 $Nm^3/h$ to 2,000 $Nm^3/h$ are each supplied to a center tube, hydrogen within a range of from 50 $Nm^3/h$ to 150 $Nm^3/h$ and air within a range of from 50 $Nm^3/h$ to 200 $Nm^3/h$ are each supplied to a first annular tube, and air within a range of 100 $Nm^3/h$ to 300 $Nm^3/h$ is supplied to a second annular tube. Then, in the embodiment just described, each gas supply amount is adjusted mutually within the above-mentioned ranges so that the adiabatic flame temperature of flame to be formed becomes 1,800° C. or more. It should be noted that, when a burner having a different center tube diameter is used, each gas amount may be increased or decreased depending on an opening area.

The silica for CMP according to the embodiment of the present invention may be used by being appropriately subjected to known surface treatment through use of a known surface treatment agent. Further, the silica for CMP according to the embodiment of the present invention may be used for applications other than the CMP method application and can be used for, for example, fillers of various resins, external additives for electrophotographic toner, and the like.

EXAMPLES

Now, the present invention is described in more detail by way of Examples. However, the present invention is not limited to these Examples.

It should be noted that measurement of various physical properties and the like in Examples and Comparative Examples below are performed by the following methods.

(1) Measurement of Specific Surface Area:

The specific surface area was measured by a nitrogen adsorption BET one point method through use of a specific surface area measurement apparatus (SA-1000) manufactured by Sibata Scientific Technology Ltd.

(2) Measurement of Particle Density:

A dry automatic density meter AccuPyc 1330 with 10 ml sample insert manufactured by Shimadzu Corporation was used and a He gas at a pressure of 0.16 Pa was used. The measurement temperature of a measurement instrument was kept at 25° C. through warm water circulation. As pretreatment of a sample, the sample was subjected to uniaxial press under the following conditions so as to increase the filling amount of the sample. Silica was filled into a press mold made of cemented carbide having a diameter of 50 mm and a height of 75 mm and subjected to compression molding under a pressure of 15 tons through use of MH-15 TON press (ram diameter: 55 mm) manufactured by Masada Seisakusho Co., Ltd. The pressure was retained for about 2 seconds and released, and the sample was removed from the mold. The compressed sample was dried for 8 hours under a pressure of 0.095 PaG or less at 200° C. in a vacuum drier and was allowed to cool to room temperature under reduced pressure in the drier, to thereby being subjected to measurement.

(3) Measurement of Coefficient of Variation in Primary Particle Diameter:

1 mg of a silica for CMP and 10 ml of pure water placed in a sample tube bottle were subjected to ultrasonic cleaning for 30 minutes with an ultrasonic cleaner filled with about 1 L of water ("MODEL VS-D100" manufactured by Iuchi Seieido Co., Ltd.). A grid with a support film (carbon-reinforced collodion film, Cu 150 mesh) was subjected to hydrophilic treatment at a current of 10 mA for 60 seconds with a sputter coater having a target removed. A suspension of the silica for CMP was dropped onto the grid placed on filter paper, and the suspension remaining on the grid was absorbed with the filter paper. The resultant was air-dried to be used as an observation sample. The observation sample was observed at a magnification of 150,000 times through use of a transmission electron microscope ("JEM-200CX" manufactured by JEOL Ltd.), and 25 images per sample were taken. The images were subjected to circular particle analysis with an image analysis apparatus ("IP-1000C" manufactured by Asahi Engineering Co., Ltd.), and an average particle diameter, a particle diameter standard deviation, and a coefficient of variation in primary particle diameter were calculated based on a particle size distribution and an integrated value of a particle size.

(4) Measurement of α Value by Small-Angle X-Ray Scattering: A silica for CMP was filled into a through hole of a sample holder having a length of 40 mm, a width of 5 mm, and a thickness of 1 mm. Both sides of the filled sample were held by being interposed between polypropylene films each having a thickness of 6 μm. The resultant was subjected to measurement. The measurement was performed with a Cu-Kα ray as an incident X-ray at a tube voltage of 40 kV, a tube current of 300 mA, a slit width of 10 μm, and a detector scanning angle of from 0.025 degree to 0.900 degree through use of a biaxial small-angle X-ray scattering apparatus (M18XHF22) manufactured by Mac Science equipped with Kratzky U-slit. The measurement was performed 5 times per sample, and an average value thereof was defined as a measurement value. The obtained small-angle X-ray scattering curve was analyzed. Periodic structures having sizes falling within ranges of from 3 nm to 5 nm, from 5 nm to 10 nm, from 10 nm to 20 nm, from 20 nm to 30 nm, from 30 nm to 50 nm, and from 50 nm to 70 nm were each calculated for an α value, and the maximum value thereof was defined as an αmax value. The α value measurement was specifically performed by a method disclosed in JP 4756040 B2. It should be noted that the contents of this patent are incorporated herein as part of the description of Description of the present application.

(5) Measurement of Scratch Density and Polishing Rate, and Determination Standard:

—Condition for Preparing Slurry—

A sample slurry used for evaluating the scratch density and the polishing rate was prepared in accordance with Yamaguchi et al., "Relationship between fumed silica slurry for CMP and scratch defect occurrence," Proceedings of 2010 JSPE Kumamoto Local Lecture Meeting, The Japan Society for Precision Engineering, pp. 1-2 (hereinafter referred to simply as "Proceedings"), "2.1 Condition for preparing slurry" and the condition for preparing prototype slurry sample 2 illustrated in FIG. 1. It should be noted that, in preparing the sample slurry, a silica for CMP of each Example and Comparative Example was used as silica. Further, various stirring and dispersing devices and dispersion conditions used for preparing the slurry were changed with respect to the conditions described in the "Proceedings" as described below. Stirring was performed for 5 minutes at 600 rpm through use of Three-One Motor BL 1200 manufactured by Shinto Scientific Co., Ltd., and then, stirring was performed for 10 minutes at 10,000 rpm through use of T.K. Homo Mixer MARK2 manufactured by Tokushu Kika Kogyo Co., Ltd. Next, dispersion was performed once at 80 MPaG through use of Nanomizer II manufactured by Yoshida Kikai Co. Ltd. Further, for filtration, a filter (profile II, filtration accuracy: 1 μm, material: polypropylene) manufactured by Pall Corporation was used. It should be noted that the contents of Proceedings described above are incorporated herein as part of the description of Description of the present specification.

—Polishing Condition—

Polishing using the slurry was performed under "2.2 Condition for polishing copper wafer" and the condition illustrated in Table 1 and FIG. 2 of the Proceedings except that a sample slurry prepared by the above-mentioned procedure was used as a sample slurry to be used for CMP processing (final CMP). It should be noted that a polishing apparatus used herein is a table-top polishing apparatus NF-300 manufactured by Nano Factor Co., Ltd., and an object to be polished (copper wafer) is a Cu-plated Si wafer of 3 inches (thickness of Cu plating: 5 μm) manufactured by D-process. Further, as a residual abrasive grain organic matter removal agent (cleaning liquid) of the copper wafer surface after CMP processing (final CMP), Clean 100 manufactured by Wako Pure Chemical Industries, Ltd. was diluted 10-fold to be used.

—Measurement of Scratch Density and Polishing Rate—

The copper wafer in which the surface having the Cu-plated film was polished under the above-mentioned polishing condition was measured for a scratch density and a polishing rate. Herein, the scratch density was measured through the procedure illustrated in "2.3 Measurement of number of scratches" and FIG. 3 of Proceedings. It should be noted that the scratch evaluation of the Cu-plated film has a correlation with the scratch evaluation of a silicon oxide film (insulating film) (see Proceedings). Thus, it is presumed that the same tendency as that of the measurement results of the scratch density described later is also obtained in the case of polishing the silicon oxide film (insulating film).

Further, the polishing rate was determined by measuring a weight difference between the weight of the Cu-plated Si wafer before polishing of the surface of the Cu-plated Si wafer and the weight of the Cu-plated Si wafer after the polishing and converting the weight difference into a polishing rate (nm/min) per minute. In this case, for measuring the weight of the Cu-plated Si wafer, AB135-S type (minimum weighing weight: 0.00001 g) manufactured by Mettler Toledo International Inc. was used. It should be noted that the polishing rate was determined based on the following expression (3):

$$\text{Polishing rate(nm/min)} = \Delta W/(\rho \times S \times t) \qquad \text{Expression (3)}$$

It should be noted that, in the expression (3), ΔW represents a weight difference (g) between the weight of the Cu-plated Si wafer before polishing and the weight of the Cu-plated Si wafer after polishing; ρ represents a Cu density of 8.92 g/cm$^3$; S represents an area of the surface of the Cu-plated Si wafer (surface having the Cu-plated film) of 45.1 cm$^2$; and t represents a polishing time of 2 minutes.

—Determination Standard of Scratch Density and Polishing Rate—

(a) Scratch Density:

The allowable value of the scratch density is 80 pcs/mm$^2$ or less, and the scratch density is more desirably 40 pcs/mm$^2$ or less.

(b) Polishing Rate:

The allowable value of the polishing rate is 12 nm/min or more, and the polishing rate is more desirably 17 nm/min or more.

(6) Measurement of Contents of Impurities:

The silica for CMP of each Example and Comparative Example was subjected to pretreatment by adding hydrogen fluoride and nitric acid to the silica for CMP, followed by heating, and the content of each impurity was measured by ICP emission analysis with a residual being an aqueous solution. For measurement, an ICP emission analysis apparatus Vista-MPX manufactured by Agilent Technologies, Inc. was used, and as a standard solution for ICP, ICP multi-element standard IX (for 23 elements) manufactured by Merck, Ltd. was used, with an ICP standard solution manufactured by Wako Pure Chemical Industries, Ltd. being used for Ti and Zr. Of the elements contained in the standard solution, the contents of any of the elements excluding Fe, Al, Ni, and Cr were less than 0.1 ppm. Therefore, Fe, Al, Ni, and Cr were defined as marker elements of impurities. Regarding the results, the contents of Fe and Al were respectively obtained as oxides of $Fe_2O_3$ and $Al_2O_3$, and the contents of Ni and Cr were obtained as simple substances of the metal elements.

(7) Measurement of Contents of Phosphorus and Boron:

The silica for CMP of each Example and Comparative Example was placed in a vessel made of a polytetrafluoroethylene resin, and mannitol for boron quantitative determination manufactured by Merck Ltd. was added thereto. Then, distilled hydrofluoric acid and distilled nitric acid were added to the resultant to dissolve the silica. The dissolved solution was evaporated to dryness on a hot plate at 160° C., and thereafter, 1% ultrapure-100 nitric acid (manufactured by Kanto Chemical Co., Inc.) was added to the resultant to obtain a sample for purity analysis. The sample for purity analysis was measured for $^{31}P$ through use of double focusing ICP-MS element II manufactured by Thermo Fisher Scientific Inc. Boron was measured by an ICP emission method.

(8) Measurement of Concentration of Chlorine:

The concentration of chlorine was measured by nephelometry using silver thiocyanate. The obtained measurement value was defined as the concentration of chlorine.

(9) Measurement of Content of Water:

The content of water was measured by a loss-on-drying method involving heating at 110° C. for 12 hours in a drier.

Examples 1 to 3

A closed triple tube burner having a center tube with an inner diameter of 100 mm was set in a closed reaction vessel, and a tetrachlorosilane ($SiCl_4$) gas serving as a rawmaterial gas, hydrogen, and a mixed gas serving as a supporting gas containing air and oxygen mixed in advance were supplied to the center tube. Hydrogen and air were supplied to a first annular tube to form pilot flame. Air was allowed to flow through a second annular tube to prevent the adhesion of the silica to the burner. The amounts of impurities in the tetrachlorosilane gas were as follows: the amount of Fe was less than 0.1 ppm in terms of $Fe_2O_3$; the amount of Al was less than 0.1 ppm in terms of $Al_2O_3$; the amount of Ni was less than 0.1 ppm; the amount of Cr was less than 0.1 ppm; the amount of boron was less than 0.1 ppm; and the amount of phosphorus was 0.2 ppm. Hydrogen was supplied to the raw material gas containing tetrachlorosilane in a ratio of 100 mol % so as to be 1.15 times, 1.3 times, and 1.5 times of the theoretical hydrogen amount, to thereby causing thermal hydrolysis at each temperature equal to or more than the adiabatic flame temperature of 1,950° C. to obtain each fumed silica. In order to prevent burnout in a process after the reaction vessel, air was allowed to flow through the reaction vessel for cooling. The internal pressure in the reaction vessel during a burning reaction was 10 kPaG or more in each case. Each fumed silica thus obtained was compressed by deaeration press to adjust the fumed silica to an apparent density of 50 g/L. The reaction conditions and the evaluation results of physical properties are respectively shown in Tables 1 and 2.

Example 4

A closed triple tube burner having a center tube with an inner diameter of 25 mm was used, and the burner configuration of the center tube, the first annular tube, and the second annular tube was set to be the same as those of Examples 1 to 3. Flow gas species flowing through each tube were also set to be the same as those of Examples 1 to 3, and the amounts of hydrogen and air to be supplied to the center tube were changed to set the adiabatic flame temperature to 2,260° C. Further, air was similarly allowed to flow through the reaction vessel so as to prevent burnout in a process. The fumed silica thus obtained was compressed by deaeration press to adjust the fumed silica to an apparent density of 50 g/L. The reaction conditions and the evaluation results of physical properties are respectively shown in Tables 1 and 2.

Example 5

A closed triple tube burner having a center tube with an inner diameter of 100 mm was used, and the burner configuration of the center tube, the first annular tube, and the second annular tube was set to be the same as those of Examples 1 to 3. Flow gas species flowing through each tube were also set to be the same as those of Examples 1 to 3, and the amounts of hydrogen and air to be supplied to the center tube were changed to set the adiabatic flame temperature to 1,870° C. The fumed silica thus obtained was compressed by deaeration press. Thus, fumed silica having an apparent density adjusted to 50 g/L was obtained. Other reaction conditions and the evaluation results of physical properties are respectively shown in Tables 1 and 2.

Example 6

A closed triple tube burner having a center tube with an inner diameter of 100 mm was used, and the burner configuration of the center tube, the first annular tube, and the second annular tube was set to be the same as those of Examples 1 to 3. Flow gas species flowing through each tube were set to be the same as those of Examples 1 to 3 except that the raw material gas was changed to methyltrichlorosilane ($CH_3SiCl_3$), and the amounts of hydrogen and air to be supplied to the center tube were changed to set the adiabatic flame temperature to 2,040° C. The amounts of impurities in the methyltrichlorosilane gas used as the raw material gas were as follows: the amount of Fe was less than 0.1 ppm in terms of $Fe_2O_3$; the amount of Al was less than 0.1 ppm in terms of $Al_2O_3$; the amount of Ni was less than 0.1 ppm; the amount of Cr was less than 0.1 ppm; the amount of boron was less than 0.5 ppm; and the amount of phosphorus was less than 0.1 ppm. The fumed silica thus obtained was compressed by deaeration press to adjust the fumed silica to an apparent density of 50 g/L. The reaction conditions and the evaluation results of physical properties are respectively shown in Tables 1 and 2.

Example 7

A closed triple tube burner having a center tube with an inner diameter of 100 mm was used, and the burner configuration of the center tube, the first annular tube, and the second annular tube was set to be the same as those of Examples 1 to 3. Flow gas species flowing through each tube were set to be the same as those of Examples 1 to 3 except that the raw material gas was changed to trichlorosilane ($HSiCl_3$), and the amounts of hydrogen and air to be supplied to the center tube were changed to set the adiabatic flame temperature to 2,010° C. The amounts of impurities in the trichlorosilane gas used as the raw material gas were as follows: the amount of Fe was less than 0.1 ppm in terms of $Fe_2O_3$; the amount of Al was less than 0.1 ppm in terms of $Al_2O_3$; the amount of Ni was less than 0.1 ppm; the amount of Cr was less than 0.1 ppm; the amount of boron was less than 0.1 ppm; and the amount of phosphorus was less than 0.1 ppm. The fumed silica thus obtained was compressed by deaeration press to adjust the fumed silica to an apparent density of 50 g/L. The reaction conditions and the evaluation results of physical properties are respectively shown in Tables 1 and 2.

Example 8

A closed triple tube burner having a center tube with an inner diameter of 100 mm was used, and the burner configuration of the center tube, the first annular tube, and the second annular tube was set to be the same as those of Examples 1 to 3. Flow gas species flowing through each tube were also set to be the same as those of Examples 1 to 3, and the amounts of hydrogen and air to be supplied to the center tube were changed to set the adiabatic flame temperature to 2,100° C. The fumed silica thus obtained was compressed by deaeration press to adjust the fumed silica to an apparent density of 50 g/L. Other reaction conditions and the evaluation results of physical properties are respectively shown in Tables 1 and 2.

Comparative Example 1

A closed triple tube burner having a center tube with an inner diameter of 100 mm was used, and the burner configuration of the center tube, the first annular tube, and the second annular tube was set to be the same as those of Examples 1 to 3. Flow gas species flowing through each tube were also set to be the same as those of Examples 1 to 3, and the amounts of air and hydrogen to be supplied to the center tube were changed to set the adiabatic flame temperature to 1,780° C. The fumed silica thus obtained was compressed by deaeration press to adjust the fumed silica to an apparent density of 50 g/L. Other reaction conditions and the evaluation results of physical properties are respectively shown in Tables 1 and 2.

Comparative Example 2

A closed triple tube burner having a center tube with an inner diameter of 25 mm was used, and the burner configuration of the center tube, the first annular tube, and the second annular tube was set to be the same as those of Examples 1 to 3. Flow gas species flowing through each tube were also set to be the same as those of Example 4, and the amounts of air and hydrogen to be supplied to the center tube were changed to set the adiabatic flame temperature to 1,150° C. Further, the pressure in the reaction vessel was allowed to be a negative pressure by suctioning the gas in the reaction vessel with an external fan. The fumed silica thus obtained was compressed by deaeration press to adjust the fumed silica to an apparent density of 50 g/L. Other reaction conditions and the evaluation results of physical properties are respectively shown in Tables 1 and 2.

Comparative Example 3

A closed triple tube burner having a center tube with an inner diameter of 100 mm was used, and the burner configuration of the center tube, the first annular tube, and the second annular tube was set to be the same as those of Examples 1 to 3. Flow gas species flowing through each tube were set to be the same as those of Examples 1 to 3 except that the raw material gas was changed to a mixed gas of 90 mol % of tetrachlorosilane ($SiCl_4$) and 10 mol % of methyldichlorosilane ($MeHSiCl_2$), and the amounts of air and hydrogen to be supplied to the center tube were changed to set the adiabatic flame temperature to 2,140° C. The fumed silica thus obtained was compressed by deaeration press to adjust the fumed silica to an apparent density of 50 g/L. The reaction conditions and the evaluation results of physical properties are respectively shown in Tables 1 and 2.

Comparative Example 4

A closed triple tube burner having a center tube with an inner diameter of 25 mm was used, and the burner configuration of the center tube, the first annular tube, and the second annular tube was set to be the same as those of Examples 1 to 3. Flow gas species flowing through each tube were set to be the same as those of Example 4 except that the raw material gas was changed to methyltrichlorosilane ($CH_3SiCl_3$), and the amounts of hydrogen, air, and oxygen to be supplied to the center tube were changed to set the adiabatic flame temperature to 3,280° C. The amounts of impurities in the methyltrichlorosilane gas were as follows: the amount of Fe was less than 0.1 ppm in terms of $Fe_2O_3$; the amount of Al was less than 0.1 ppm in terms of $Al_2O_3$; the amount of Ni was less than 0.1 ppm; the amount of Cr was less than 0.1 ppm; the amount of boron was less than 0.5 ppm; and the amount of phosphorus was less than 0.1 ppm. Further, air was similarly allowed to flow through the reaction vessel so as to prevent burnout in a process. The fumed silica thus obtained was compressed by deaeration press to adjust the fumed silica to an apparent density of 50 g/L. The reaction conditions and the evaluation results of physical properties are respectively shown in Tables 1 and 2.

TABLE 1

| | Hydrogen excess ratio (—) | Oxygen excess ratio (—) | Adiabatic flame temperature (° C.) | Burner center tube flow rate (m/sec) | Internal pressure of reaction vessel (kPaG) |
|---|---|---|---|---|---|
| Example 1 | 1.15 | 0.9 | 1,980 | 70 | 11 |
| Example 2 | 1.3 | 0.9 | 1,990 | 82 | 12 |
| Example 3 | 1.5 | 0.9 | 1,990 | 96 | 12 |
| Example 4 | 1.25 | 1.0 | 2,260 | 80 | 20 |
| Example 5 | 1.25 | 1.1 | 1,870 | 60 | 11 |
| Example 6 | 1.5 | 1.1 | 2,040 | 75 | 11 |
| Example 7 | 1.5 | 1.3 | 2,010 | 75 | 11 |
| Example 8 | 1.5 | 0.9 | 2,100 | 53 | 17 |
| Comparative Example 1 | 1.25 | 1.2 | 1,780 | 77 | 14 |
| Comparative Example 2 | 1.25 | 2.3 | 1,150 | 115 | −15 |
| Comparative Example 3 | 1.3 | 0.9 | 2,140 | 45 | 7 |
| Comparative Example 4 | 2.0 | 1.0 | 3,280 | 75 | 0 |

Hydrogen excess ratio: magnification ratio with respect to stoichiometric hydrogen amount required for thermal hydrolysis of silane compound Oxygen excess ratio: magnification ratio with respect to stoichiometric oxygen amount required for burning of hydrogen to be added as a source for forming flame

TABLE 2

|  | Particle density (g/cm³) | Primary particle diameter (nm) | Coefficient of variation in primary particle diameter (—) | αmax particle diameter (nm) | α max (—) | Specific surface area (m²/g) |
|---|---|---|---|---|---|---|
| Example 1 | 2.24 | 22 | 0.38 | 20-30 | 3.0 | 81 |
| Example 2 | 2.25 | 20 | 0.38 | 20-30 | 3.0 | 83 |
| Example 3 | 2.25 | 20 | 0.37 | 20-30 | 3.2 | 83 |
| Example 4 | 2.27 | 21 | 0.31 | 20-30 | 3.2 | 82 |
| Example 5 | 2.25 | 15 | 0.35 | 10-20 | 3.0 | 155 |
| Example 6 | 2.26 | 20 | 0.36 | 20-30 | 3.0 | 83 |
| Example 7 | 2.27 | 18 | 0.36 | 20-30 | 3.2 | 90 |
| Example 8 | 2.26 | 35 | 0.37 | 20-30 | 2.9 | 50 |
| Comparative Example 1 | 2.24 | 11 | 0.34 | 5-10 | 3.1 | 220 |
| Comparative Example 2 | 2.23 | 25 | 0.42 | 20-30 | 3.0 | 320 |
| Comparative Example 3 | 2.24 | 23 | 0.45 | 20-30 | 2.8 | 83 |
| Comparative Example 4 | 2.25 | 40 | 0.50 | 30-50 | 3.0 | 38 |

|  | Content of Fe (ppm) | Content of Al (ppm) | Content of Cr (ppm) | Content of Ni (ppm) | Content of B (ppm) | Content of P (ppm) | Content of water (%) | Content of chlorine (ppm) | Scratch density (pcs/mm²) | Polishing rate (nm/min) |
|---|---|---|---|---|---|---|---|---|---|---|
| Example 1 | 0.2 | 0.2 | 0.1 | 0.1 | 0.3 | 0.40 | 0.5 | 45 | 27 | 21 |
| Example 2 | 0.2 | 0.2 | <0.1 | <0.1 | <0.1 | 0.30 | 0.3 | 43 | 24 | 17 |
| Example 3 | 0.1 | 0.1 | <0.1 | <0.1 | <0.1 | 0.28 | 0.1 | 35 | 20 | 20 |
| Example 4 | <0.1 | <0.1 | <0.1 | <0.1 | <0.1 | 0 | 0.1 | 10 | 14 | 22 |
| Example 5 | 0.1 | <0.1 | <0.1 | 0.1 | <0.1 | 0.18 | 0.2 | 46 | 70 | 23 |
| Example 6 | 0.2 | 0.2 | 0.1 | 0.1 | 1.2 | 0.01 | 0.2 | 25 | 31 | 20 |
| Example 7 | <0.1 | <0.1 | <0.1 | <0.1 | <0.1 | <0.01 | 0.2 | 30 | 39 | 21 |
| Example 8 | 0.3 | 0.2 | <0.1 | <0.1 | <0.1 | 0.20 | 0.1 | 33 | 15 | 13 |
| Comparative Example 1 | <0.1 | 0.1 | <0.1 | <0.1 | <0.1 | 0.11 | 0.1 | 31 | 300 | 30 |
| Comparative Example 2 | 0.1 | 0.2 | <0.1 | <0.1 | <0.1 | 0.17 | 0.2 | 33 | 120 | 35 |
| Comparative Example 3 | 0.3 | 0.1 | <0.1 | <0.1 | <0.1 | 0.24 | 0.3 | 34 | 101 | 22 |
| Comparative Example 4 | 0.2 | 0.1 | <0.1 | <0.1 | <0.1 | 0.30 | 0.1 | 21 | 49 | 10 |

The invention claimed is:

1. A silica for CMP, which satisfies the following (A) to (C):
   (A) a BET specific surface area of 40 m²/g or more and 180 m²/g or less;
   (B) a particle density measured by a He-gas pycnometer method of 2.24 g/cm³ or more; and
   (C) a coefficient of variation in primary particle diameter calculated by TEM/image analysis of 0.40 or less.

2. A silica for CMP according to claim 1, wherein the silica for CMP has a fractal shape parameter αmax value within a particle diameter range of from 3 nm to 70 nm of 2.9 or more.

3. A silica for CMP according to claim 1, wherein the silica for CMP has a content of Fe of 0.4 ppm or less in terms of $Fe_2O_3$.

4. A silica for CMP according to claim 1, wherein the silica for CMP has a content of Al of 0.3 ppm or less in terms of $Al_2O_3$, a content of Ni of 0.1 ppm or less, a content of Cr of 0.1 ppm or less, a content of boron of 1.3 ppm or less, and a content of phosphorus of 0.5 ppm or less.

5. A silica for CMP according to claim 1, wherein the particle density is 2.25 g/cm³ or more.

6. A silica for CMP, comprising fumed silica produced by a flame hydrolysis reaction of a silane compound, wherein the silica satisfies the following (A) to (C):
   (A) a BET specific surface area of 40 m²/g or more and 180 m²/g or less;
   (B) a particle density measured by a He-gas pycnometer method of 2.24 g/cm³ or more; and
   (C) a coefficient of variation in primary particle diameter calculated by TEM/image analysis of 0.40 or less.

7. An aqueous dispersion, comprising a silica for CMP satisfying the following (A) to (C):
   (A) a BET specific surface area of 40 m²/g or more and 180 m²/g or less;
   (B) a particle density measured by a He-gas pycnometer method of 2.24 g/cm³ or more; and
   (C) a coefficient of variation in primary particle diameter calculated by TEM/image analysis of 0.40 or less.

8. A method of producing a silica for CMP by subjecting a silane compound to hydrolysis in flame formed in a reaction vessel,
   the method comprising producing, under a production condition of an adiabatic flame temperature of 1,800° C. or more and a pressure in the reaction vessel of 10 kPaG or more, a silica for CMP satisfying the following (A) to (C):
   (A) a BET specific surface area of 40 m²/g or more and 180 m²/g or less;
   (B) a particle density measured by a He-gas pycnometer method of 2.24 g/cm³ or more; and
   (C) a coefficient of variation in primary particle diameter calculated by TEM/image analysis of 0.40 or less.

9. A method of producing a silica for CMP according to claim 8,
   wherein the flame is formed by a multi-tube burner, wherein the silane compound is supplied to the flame by being supplied to a center tube of the multi-tube burner, and wherein a gas flow rate in the center tube of the multi-tube burner is from 50 m/sec to 100 m/sec in terms of a standard state.

* * * * *